United States Patent
Lin et al.

(10) Patent No.: US 8,242,034 B2
(45) Date of Patent: Aug. 14, 2012

(54) PHASE CHANGE MEMORY DEVICES AND METHODS FOR FABRICATING THE SAME

(75) Inventors: Yung-Fa Lin, Hsinchu (TW); Te-Chun Wang, Hsinchu (TW)

(73) Assignee: Powerchip Technology Corporation, Hsin-Chu (TW)

( * ) Notice: Subject to any disclaimer, the term of this patent is extended or adjusted under 35 U.S.C. 154(b) by 54 days.

(21) Appl. No.: 12/940,716

(22) Filed: Nov. 5, 2010

(65) Prior Publication Data

US 2011/0053333 A1 Mar. 3, 2011

Related U.S. Application Data

(62) Division of application No. 11/836,093, filed on Aug. 8, 2007, now Pat. No. 7,855,378.

(30) Foreign Application Priority Data

May 2, 2007 (TW) ................................ 96115564 A

(51) Int. Cl.
*H01L 47/00* (2006.01)
(52) U.S. Cl. ...................... 438/900; 257/4; 257/E47.001
(58) Field of Classification Search .................. None
See application file for complete search history.

(56) References Cited

U.S. PATENT DOCUMENTS

| | | | | |
|---|---|---|---|---|
| 6,750,079 | B2 * | 6/2004 | Lowrey et al. | 438/95 |
| 7,473,576 | B2 * | 1/2009 | Lung | 438/102 |
| 7,479,649 | B2 * | 1/2009 | Lung | 257/2 |
| 7,696,507 | B2 * | 4/2010 | Khang et al. | 257/4 |
| 8,026,503 | B2 * | 9/2011 | Tu | 257/3 |
| 8,039,392 | B2 * | 10/2011 | Lai et al. | 438/666 |
| 8,110,822 | B2 * | 2/2012 | Chen | 257/4 |
| 2006/0284237 | A1 * | 12/2006 | Park et al. | 257/314 |
| 2007/0173019 | A1 * | 7/2007 | Ho et al. | 438/257 |
| 2007/0210348 | A1 * | 9/2007 | Song et al. | 257/246 |
| 2008/0197333 | A1 * | 8/2008 | Lung | 257/2 |
| 2009/0008621 | A1 * | 1/2009 | Lin et al. | 257/3 |
| 2009/0057640 | A1 * | 3/2009 | Lin et al. | 257/3 |

* cited by examiner

*Primary Examiner* — Benjamin Sandvik

(57) ABSTRACT

Phase change memory devices and methods for manufacturing the same are provided. An exemplary embodiment of a phase change memory device includes a bottom electrode formed over a substrate. A first dielectric layer is formed over the bottom electrode. A heating electrode is formed in the first dielectric layer and partially protrudes over the first dielectric layer, wherein the heating electrode includes an intrinsic portion embedded within the first dielectric layer, a reduced portion stacked over the intrinsic portion, and an oxide spacer surrounding a sidewall of the reduced portion. A phase change material layer is formed over the first dielectric layer and covers the heating electrode, the phase change material layer contacts a top surface of the reduced portion of the heating electrode. A top electrode is formed over the phase change material layer and contacts the phase change material layer.

18 Claims, 6 Drawing Sheets

PHASE CHANGE MEMORY DEVICES AND METHODS FOR FABRICATING THE SAME

This application is a divisional of U.S. application Ser. No. 11/836,093, filed Aug. 8, 2007, the entire disclosure of which is hereby incorporated by reference.

BACKGROUND

The invention relates to memory devices, and more particularly to a phase change memory (PCM) device and a method for fabricating the same.

Phase change memory devices are non-volatile, highly readable, highly programmable, and require a relatively lower driving voltage/current. Current trends in phase change memory development are to increase cell density and reduce current density thereof.

Phase change material in a phase change memory device has at least two solid phases, a crystalline state and an amorphous state. Transformation between these two phases can be achieved by changing the temperature of the phase change material. The phase change material exhibits different electrical characteristics depending on its state. For example, in its amorphous state the material exhibits a higher resistivity than in the crystalline state. Such phase change material may switch between numerous electrically detectable conditions of varying resistivities within a nanosecond time scale with the input of pico joules of energy. Since phase change material permits reversible phase transformation, memory bit status can be distinguished by determining the phase of phase change material in the memory bit.

FIG. 1 is a schematic diagram showing a cross sectional view of a conventional phase change memory cell structure. As shown in FIG. 1, the phase change memory cell structure includes a silicon substrate 10 with a bottom electrode 12 made of conductive material such as Al or W thereon. A dielectric layer 14 is formed over the bottom electrode 12 and a heating electrode 16 is formed in a portion of the dielectric layer 14. Moreover, a patterned phase change material layer 20 is stacked over the dielectric layer 14. The patterned phase change material layer 20 is formed within a dielectric layer 18 which is formed over the dielectric layer 14 and a bottom surface of the phase change material layer 20 partially contacts the heating electrode 16. A dielectric layer 24 is formed over the dielectric layer 18 and a top electrode 22 is formed over and in the dielectric layer 24. The top electrode 22 partially covers the dielectric layer 24 and portions thereof protrude downward through the dielectric layer 24, thereby contacting the phase change material layer 20 thereunder.

In a write mode, a large current is generated by the heating electrode 16 and flows therethrough, thus heating up an interface between the phase change material layer pattern 20 and the heating electrode 16 and thereby transforming a portion (not shown) of the phase change material layer 20 into either the amorphous state or the crystalline state depending on the length of time and amount of current that flows through the heating electrode 16.

One problem is found with conventional phase change transistors is the relatively large amount of reset current required to successfully change the state of the phase change material during a write operation. One solution to reduce reset current required and to successfully turn on the phase change reaction is to reduce the contact surface between the heating electrode 16 and the phase change material layer 20, such as through reducing a diameter $D_0$ of the heating electrode 16, thereby maintaining or increasing a current density at the interface.

Reduction of the diameter $D_0$ of the heating electrode 16, however, is limited by current photolithography process ability, thereby limiting size reduction of the heating electrode 16 and ability to decrease current density.

SUMMARY

Phase change memory devices and methods for manufacturing the same are provided to thereby solve above challenges and improve conventional phase change memory devices.

An exemplary embodiment of a phase change memory device comprises a bottom electrode formed over a substrate. A first dielectric layer is formed over the bottom electrode. A heating electrode is formed in the first dielectric layer and partially protrudes over the first dielectric layer. A phase change material layer is formed over the first dielectric layer and covers the heating electrode. A top electrode is formed over the phase change material layer and contacts the phase change material layer. In one embodiment, the heating electrode comprises an intrinsic portion having a first diameter embedded within the first dielectric layer, a reduced portion having a second diameter less than the first diameter stacked over the intrinsic portion, an oxide spacer surrounding a sidewall of the reduced portion stacked over the intrinsic portion, and the phase change material layer contacting a top surface of the reduced portion of the heating electrode.

An exemplary embodiment of a method for manufacturing a phase change memory device comprises providing a substrate with a first conductive layer formed thereon. A first dielectric layer is formed over the first conductive layer and the substrate. A heating electrode is formed in a portion of the first dielectric layer, wherein the heating electrode penetrates the first dielectric layer and contacts the first conductive layer. A first etching process is performed to the first dielectric layer to reduce a thickness of the first dielectric layer and partially expose a portion of the heating electrode. An oxidation process is performed to form an oxide layer on a top surface and a sidewall of the portion of the heating electrode exposed by the first dielectric layer. A second etching process is performed to reduce portions of the oxide layer and expose a top surface of the portion of the heating electrode exposed by the first dielectric layer, thereby leaving an oxide spacer on the sidewall of the portion of the heating electrode exposed by the first dielectric layer. A phase change material layer is formed over a portion of the first dielectric layer, wherein the phase change material layer covers the portion of the heating electrode exposed by the first dielectric layer and the oxide spacer, and contacts the top surface of the portion of the heating electrode exposed by the first dielectric layer. A second conductive layer is formed over the phase change material layer, contacting the phase change material layer.

Another exemplary embodiment of a method for fabricating a phase change memory device comprises providing a substrate with a first conductive layer formed thereon. A first dielectric layer is formed over the first conductive layer and the substrate. A heating electrode is formed in a portion of the first dielectric layer, wherein the heating electrode penetrates the first dielectric layer and contacts the first conductive layer. A first etching process is performed to reduce a thickness of the first dielectric layer and partially expose a portion of the heating electrode. An oxidation process is performed to form a first oxide layer on a top surface and a sidewall of the portion of the heating electrode exposed by the first dielectric layer. A second dielectric layer is formed over the first dielectric layer, covering the first dielectric layer. A planarization process is performed to remove portions of the first oxide layer and the second dielectric layer, thereby revealing a top surface of the portion of the heating electrode exposed by the first dielectric layer and leaving a second oxide layer on the sidewall of the portion of the portion of the heating electrode exposed by the first dielectric layer. A phase change material layer is formed over a portion of the second dielectric layer, wherein the phase change material layer merely contacts the top surface of the conductive electrode and the second oxide layer. A second conductive layer is formed over the phase change material layer and contacts the phase change material layer.

Also provided is a method for reducing a contact area between a heating electrode and a phase change material layer comprises providing a first dielectric layer with a heating electrode formed therein, wherein the heating electrode has a first diameter and an exposed portion above a top surface of the first dielectric layer. An oxidation process is performed to form an oxide layer on a top surface and a sidewall of the exposed portion of the heating electrode and reduce a diameter of the exposed portion of the heating electrode from the first diameter to a second diameter less than thereof. The oxide layer is partially removed to expose a top surface of the exposed portion of the heating electrode and leave an oxide spacer on the sidewall thereof. A phase change material layer is formed over the exposed portion of the heating electrode, wherein the phase change material layer at least contacts the top surface of the exposed portion of the heating electrode and a top surface of the oxide spacer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Embodiments of phase change memory devices and methods for manufacturing the same are described as below incorporating FIGS. 2-12, wherein FIGS. 2-8 are schematic diagrams showing fabrication steps of a method for manufacturing a phase change memory device according to a first exemplary embodiment and FIGS. 9-12 are schematic diagrams showing fabrication steps of a method for manufacturing a phase change memory device according to a second exemplary embodiment.

First Embodiment

Figure 2:
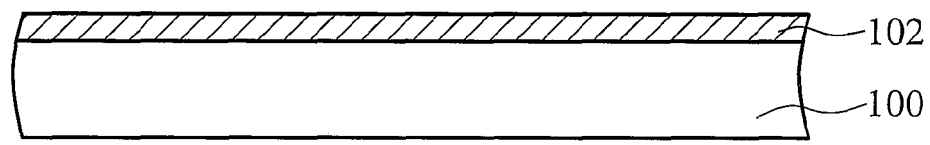
FIGS. 2-8 are cross sections showing a method for fabricating a phase change memory device according to an embodiment of the invention.

In FIG. 2, a substrate 100 such as a semiconductor substrate is first provided. Active devices such as transistors or diodes (not shown) and thin films such as dielectric layers (also not shown) can be formed on the substrate 100 but are not illustrated here. The substrate 100 is merely illustrated as a planar substrate without showing the layers or active devices formed thereon for simplicity.

As shown in FIG. 2, a layer of conductive material is then formed over the substrate 100 and patterned by sequential photolithography and etching processes (not shown), thereby forming a conductive layer 102 over the substrate 100. The conductive layer 102 may comprise conductive materials such as polysilicon, Al, or W. The conductive layer 102 may function as a bottom electrode.

Figure 3:
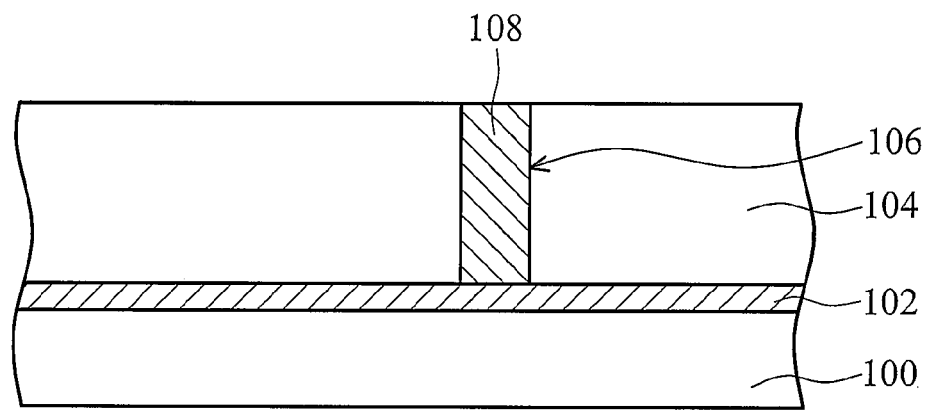

In FIG. 3, a dielectric layer 104 is then blanketly formed over the conductive layer 102 and the substrate 100. The dielectric layer 104 may comprise borophosphosilicate glass (BPSG), silicon oxide, spin-on glass (SOG) or silicon nitride formed by, for example, physical vapor deposition or spin-on method. A portion of the dielectric layer 104 is defined by sequential photolithography and etching steps (both not shown) to thereby form an opening 106 in the dielectric layer 104. The opening 106 is formed through the dielectric layer 104 and partially exposes a portion of the underlying conductive layer 102.

As shown in FIG. 3, a layer of conductive material is then blanketly deposited over the dielectric layer 104 and fills the opening 106. The portion of the conductive material above the dielectric layer 104 is then removed by a planarization process (not shown) such as a chemical mechanical polishing (CMP) process, thereby leaving a conductive electrode 108 in the opening 106 and exposing a top surface of the conductive electrode 108. Herein, the conductive electrode 108 may comprise conductive materials such as doped Si, doped SiGe, TiW, or TiN.

Figure 4:
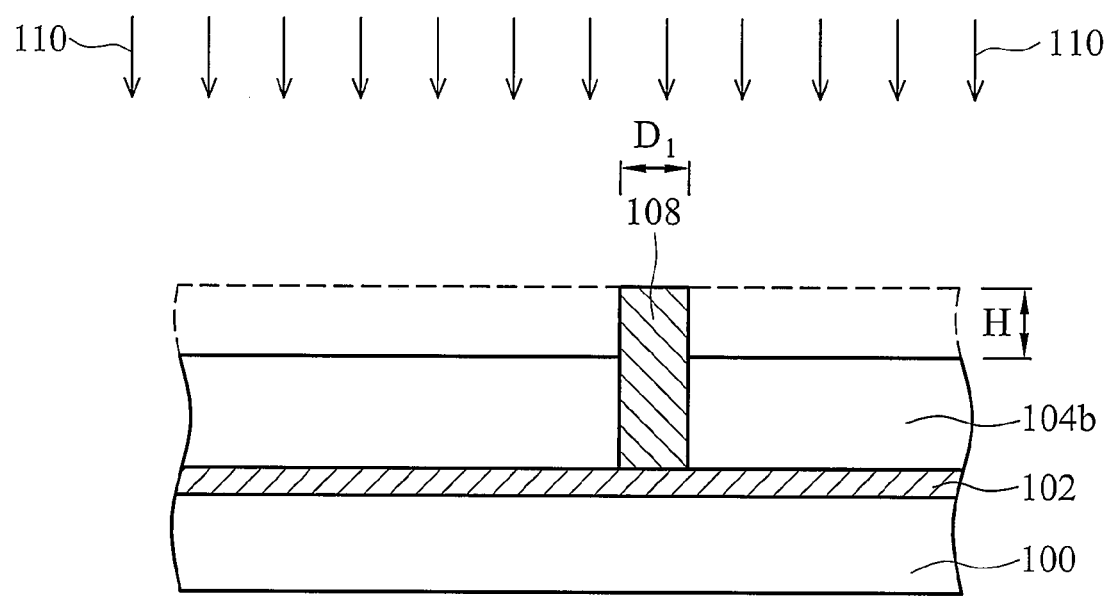

In FIG. 4, an etching process 110 is then performed to the dielectric layer 104 to remove portions thereof (illustrated as the dashed line portion) and partially exposes the conductive electrode 108, thereby forming a dielectric layer 104b with reduced thickness after the etching process 110. Herein, a portion of the conductive electrode 108 with a height H of about 10-5000 Å, preferably of about 100-4000 Å, is exposed by the dielectric layer 104b. In addition, the conductive electrode 108 is formed with a diameter $D_1$ and the diameter $D_1$ is determined by the process capability of the photolithography process (not shown) for forming the opening 106, as illustrated in FIG. 3. The conductive electrode 108 may function as a heating electrode for heating up a sequentially formed phase change material layer.

Figure 5:
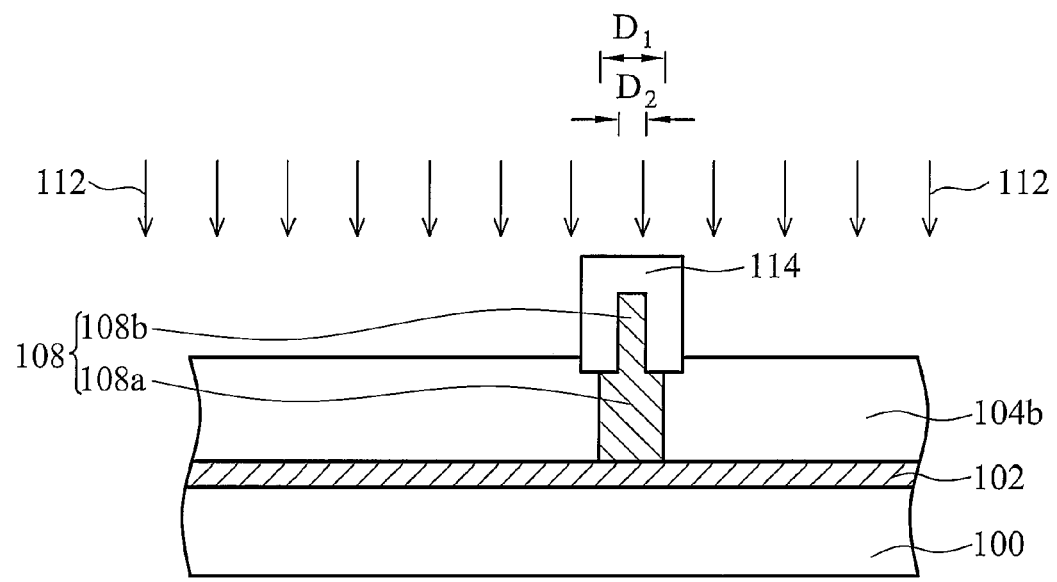

In FIG. 5, an oxidation process 112 is then performed to partially oxidize the portion of the conductive electrode 108 exposed by the dielectric layer 104b, thereby forming an oxide layer 114 over the surface of the portion of the conductive electrode 108 exposed by the dielectric layer 104b and reducing a size of the portion of the conductive electrode 108 exposed by the dielectric layer 104b. As shown in FIG. 5, the oxide layer 114 covers a top surface and sidewall surfaces of the conductive electrode 108 and slightly penetrate downward to a portion of the conductive electrode 108 below the dielectric layer 104b surface. Thus, the conductive electrode 108 may be substantially defined into two portions, wherein one is the reduced portion 108b with size reduced and an intrinsic portion 108a without size reduced. The top surface and sidewall surfaces of the reduced portion 108b are entirely covered with the oxide layer 114. The intrinsic portion 108a is embedded within the dielectric layer 104b and is not affected in the oxidation process 112. Moreover, the reduced portion 108b is substantially stacked over the intrinsic portion 108a along an axis direction (not shown), having a top surface substantially lower than that of the dielectric layer 104b. The oxidation process 112 may be a furnace oxidation process which is performed under a temperature of about 500-1000° C. for about 1-600 minutes. Process time and temperature of the oxidation process 112 is not limited to those disclosed above and may vary according to materials used in the conductive electrode 108. Through the oxidation process 112, the reduced portion 108b of the conductive electrode 108 is thus formed with a diameter $D_2$ less than the diameter $D_1$ of the intrinsic portion 108a of the conductive electrode 108. Herein, the diameter $D_2$ is about 5-1000 Å and may vary depending to the design of the phase change memory device.

Figure 6:
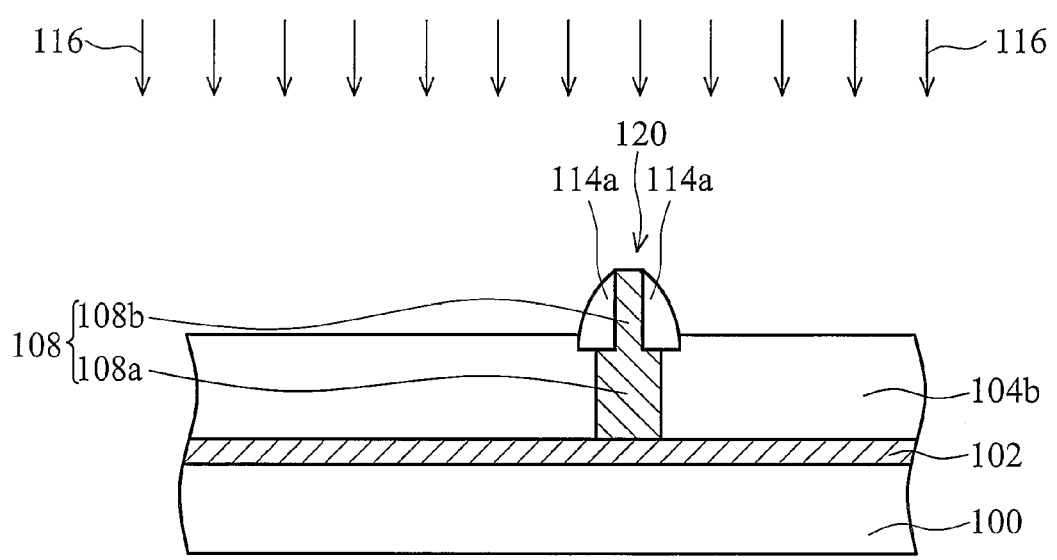

In FIG. 6, an etching process 116 is then performed to etch back the oxide layer 114, thereby exposing a top surface of the reduced portion 108b of the conductive electrode 108 and leaving an oxide spacer 114a on the sidewalls of the reduced portion 108b of the conductive electrode 108.

Figure 7:
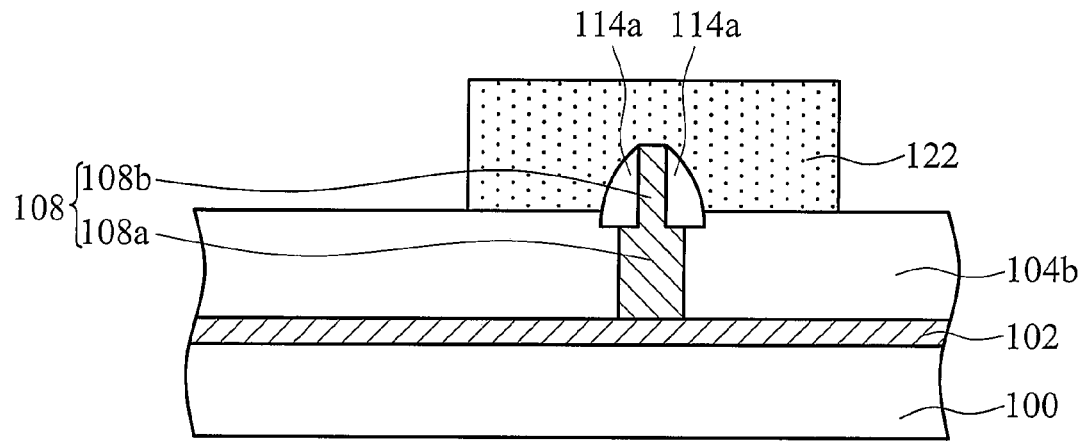

In FIG. 7, a layer of phase change material is formed over the dielectric layer 104b and covers the reduced portion 108b of the conductive electrode 108 and the oxide spacer 114a. Sequential photolithography and etching processes (both not shown) are then performed to pattern the layer of the phase change material, thereby forming a patterned phase change material layer 122 over portions of the dielectric layer 104b. As shown in FIG. 7, the phase change material layer 122 now covers the conductive electrode 108b of the conductive electrode 108 but is merely in contact with a top surface of the reduced portion 108b of the conductive electrode 108. The phase change material layer 122 is isolated from the sidewall of the reduced portion 108b of the conductive electrode 108 by the oxide spacer 114a. The phase change material layer 122 may comprise chalcogenide materials such as Ge—Sb—Te trinary chalcogenide compound or Te—Sb binary chalcogenide compound.

Figure 8:
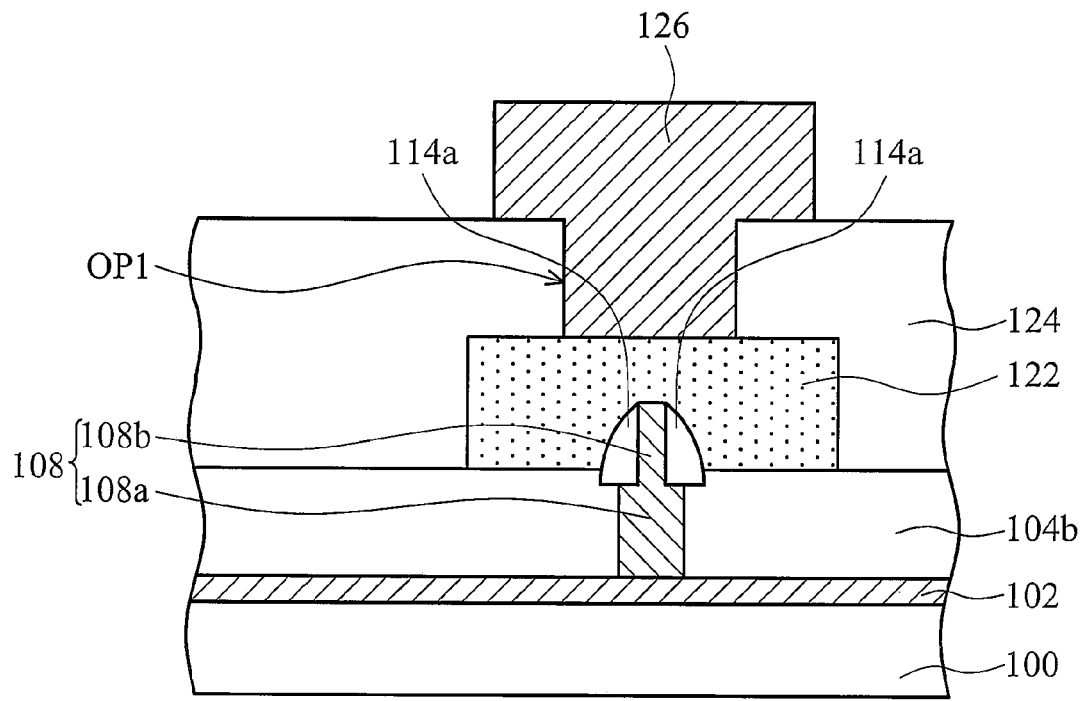

In FIG. 8, a dielectric layer 124 is then formed over the dielectric layer 104b and blankly covers the phase change material layer 122 formed on the dielectric layer 104b. Next, sequential photolithography and etching processes (both not shown) are performed to define the dielectric layer 124, thereby forming an opening $OP_1$ therein. The opening $OP_1$ partially exposes the phase change material layer 122. The dielectric layer 124 may comprise borophosphosilicate glass (BPSG), silicon oxide, spin-on glass (SOG) or silicon nitride formed by, for example, physical vapor deposition or spin-on methods. Next, a layer of conductive material layer is formed over the dielectric layer 124 and fills the opening $OP_1$. The layer of conductive material is defined by sequential photolithography and etching processes (both not shown), thereby forming a conductive layer 126 over the dielectric layer 124 as a top electrode. The conductive layer 126 also has a part penetrating downward through the dielectric layer 124, thereby contacting the phase change material layer 122. The conductive layer 126 may comprise conductive materials such as Al or W.

Figure 1:
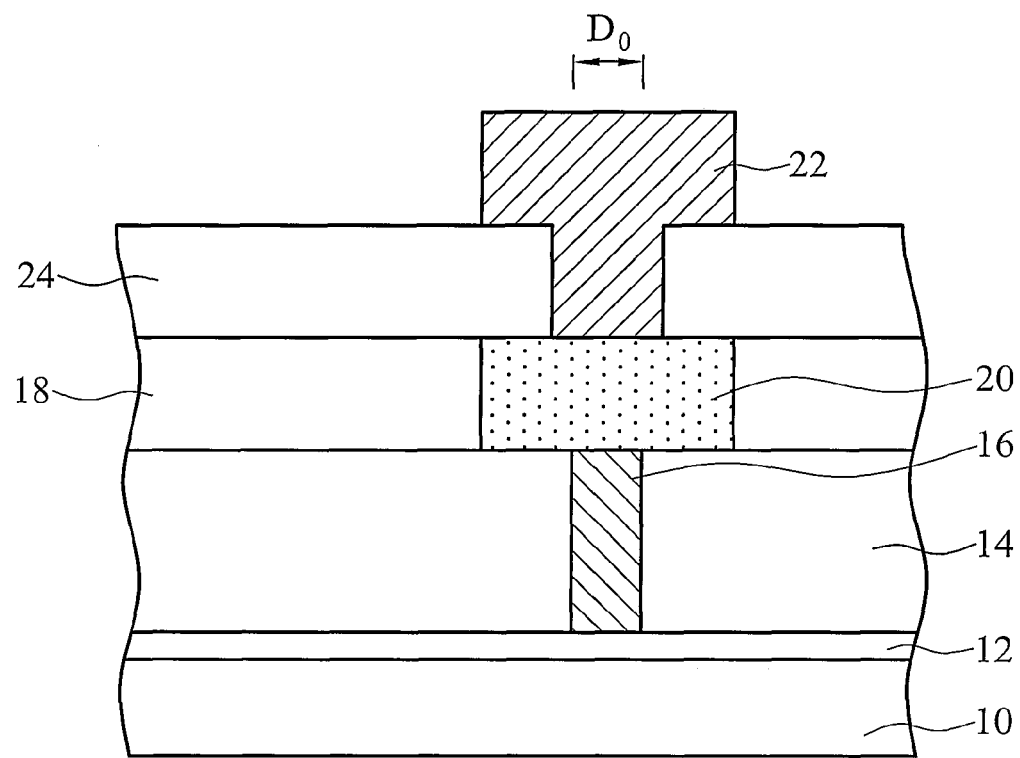
FIG. 1 is cross section of a conventional phase change memory cell structure.

Compared with the conventional phase change memory cell structure illustrated in FIG. 1, a diameter of the heating electrode in the phase change memory device of the first embodiment is properly reduced during an oxidation process, thereby reducing a contact area between the phase change material layer and the heating electrode, increasing current density applied to the phase change material layer, and reducing a reset current for transforming a portion of the phase change material layer from a crystal state into an amorphous state. Thus, the fabrication method illustrated in the first embodiment is not restricted to a process capability of the photolithography process used therein as those met during fabrications of the conventional phase change memory cell structures. A contact area between the heating electrode and the phase change material layer can be further reduced through incorporating the oxidation process into a process for fabricating phase change memory devices.

Second Embodiment

FIGS. 9~12 are schematic diagrams showing different fabrication steps of a method for manufacturing a phase change memory device according to a second embodiment of the invention. The second embodiment is modified from the first embodiment and merely differences therebetween are illustrated for simplicity. Same components as those disclosed in the first embodiment are illustrated with same numerals.

Figure 9:
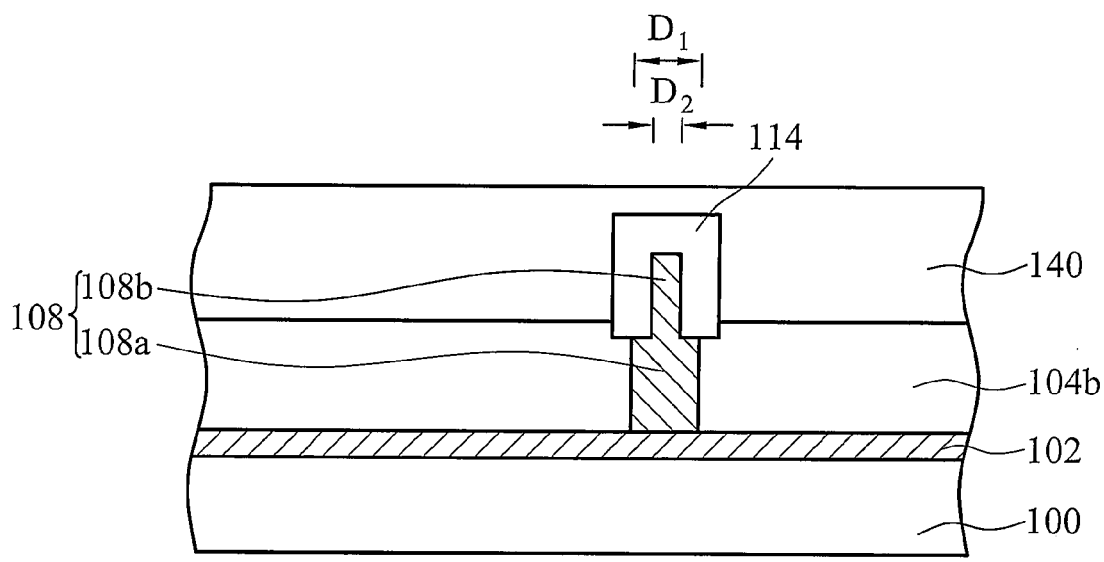
FIGS. 9-12 are cross sections showing a method for fabricating a phase change memory device according to another embodiment of the invention.

In FIG. 9, a structure as illustrated in FIG. 5 is first provided through fabrication methods illustrated in FIGS. 2-5, as an initial structure. Next, a dielectric layer 140 is formed over the initial structure to planarize the surface thereof. As shown in FIG. 9, the dielectric layer 140 is formed over the dielectric layer 104b and covers a top surface of the oxide layer 114. The conductive electrode 108 now includes a reduced portion 108b and an intrinsic portion 108a, having diameters $D_2$ and $D_1$, respectively.

Figure 10:
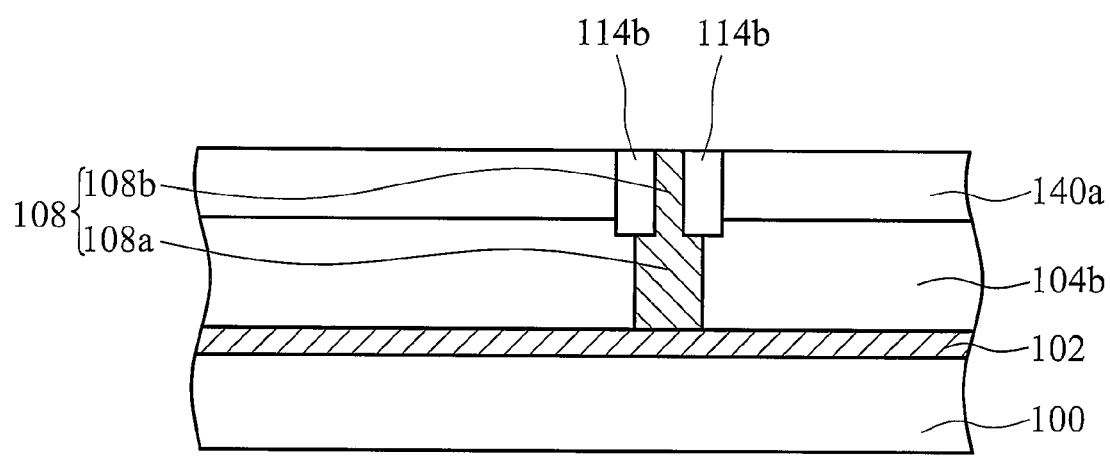

In FIG. 10, a planarization process (not shown) such as a chemical mechanical polishing (CMP) process or an etching back process is then performed to remove portions of the oxide layer 114 and the dielectric layer 140 above a top surface of the reduced portion 108b of the conductive electrode 108, thereby exposing the top surface of the reduced portion 108b of the conductive electrode and forming an oxide layer 114b on sidewalls thereof. Thus, a dielectric layer 140a with reduced thickness is also formed.

Figure 11:
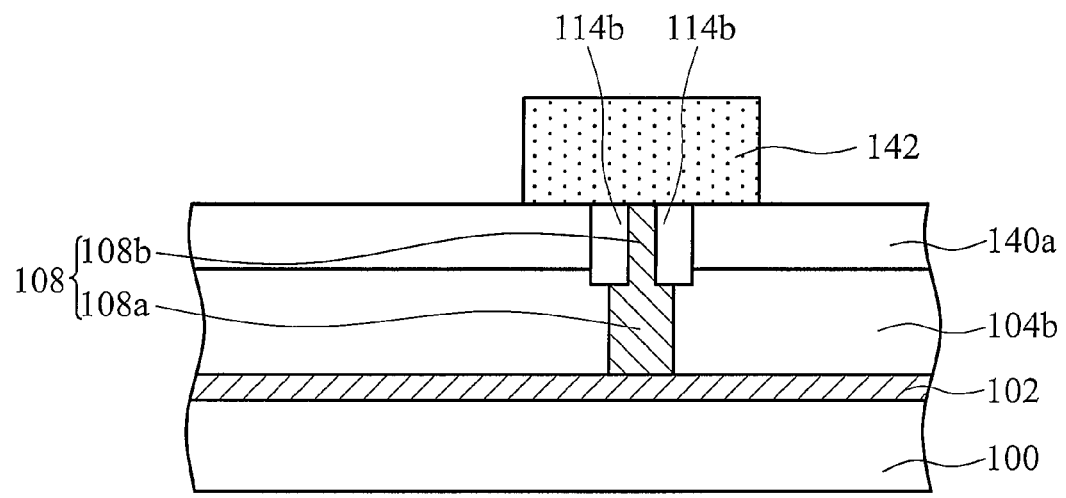

In FIG. 11, a layer of phase change material is then blanketly formed to cover the reduced portion 108b of the conductive electrode 108, the oxide spacer 114b and the dielectric layer 140a. Next, sequential photolithography and etching processes (both not shown) are performed to define the layer of phase change material, thereby forming a patterned phase change material layer 142 on portions of the dielectric layer 140a. As shown in FIG. 11, the phase change material layer 142 covers the top surface of the reduced portion 108b of the conductive electrode 108 and the oxide layer 104b formed over sidewalls of the reduced portion 108b of the conductive electrode 108. The phase change material layer 142 may comprise chalcogenide materials such as Ge—Sb—Te trinary chalcogenide compound or Te—Sb binary chalcogenide compound.

Figure 12:
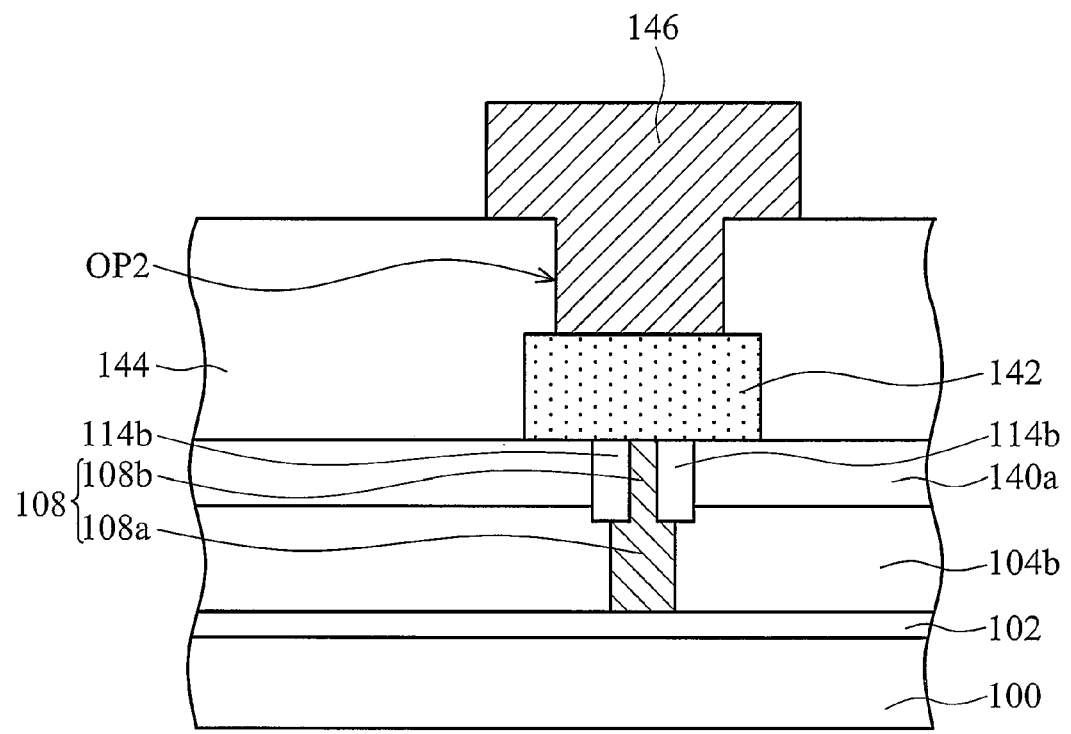

In FIG. 12, a dielectric layer 144 is then formed over the dielectric layer 140a and blanketly covers the phase change material layer 142 formed thereon. Next, sequential photolithography and etching processes (both not shown) are performed to define the dielectric layer 144, thereby forming an opening $OP_2$ therein. The opening $OP_2$ partially exposes the phase change material layer 142. The dielectric layer 144 may comprise borophosphosilicate glass (BPSG), silicon oxide, spin-on glass (SOG) or silicon nitride formed by, for example, physical vapor deposition or spin-on methods. Next, a layer of conductive material layer is formed over the dielectric layer 144 and fills the opening $OP_2$. The layer of conductive material is then defined by sequential photolithography and etching processes (both not shown), thereby forming a conductive layer 146 over the dielectric layer 144, as a top electrode. The conductive layer 146 also has a part penetrating downward through the dielectric layer 144, thereby contacting the phase change material layer 142. The conductive layer 146 may comprise conductive materials such as Al or W.

Compared with the conventional phase change memory cell structure illustrated in FIG. 1, a diameter of the heating electrode in the phase change memory device of the first embodiment is properly reduced during an oxidation process, thereby reducing a contact area between the phase change material layer and the heating electrode, increasing current density applied to the phase change material layer, and reducing a reset current for transforming a portion of the phase change material layer from a crystal state into an amorphous state. Thus, the fabrication method illustrated in the second embodiment is not restricted to a process capability of the photolithography process used therein as those met during fabrications of the conventional phase change memory cell structures. A contact area between the heating electrode and the phase change material layer can be further reduced through incorporating the oxidation process into a process for fabricating phase change memory devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a phase change memory device, comprising:
    providing a substrate with a first conductive layer formed thereon;
    forming a first dielectric layer over the first conductive layer and the substrate;
    forming a heating electrode in a portion of the first dielectric layer, wherein the heating electrode penetrates the first dielectric layer and contacts the first conductive layer;
    performing a first etching process to the first dielectric layer, reducing a thickness of the first dielectric layer and partially exposing a portion of the heating electrode;
    performing an oxidation process, forming an oxide layer on a top surface and a sidewall of the portion of the heating electrode exposed by the first dielectric layer;
    performing a second etching process, reducing portions of the oxide layer, exposing a top surface of the portion of the heating electrode exposed by the first dielectric layer, and leaving an oxide spacer on the sidewall of the portion of the heating electrode exposed by the first dielectric layer;
    forming a phase change material layer over a portion of the first dielectric layer, wherein the phase change material layer covers the portion of the heating electrode exposed by the first dielectric layer and the oxide spacer, and contacts the top surface of the portion of the heating electrode exposed by the first dielectric layer; and
    forming a second conductive layer over the phase change material layer, contacting the phase change material layer.

2. The method as claimed in claim 1, wherein the oxidation process is performed under a temperature of about 500-1000° C. for about 1-600 minutes.

3. The method as claimed in claim 1, wherein the oxidation process reduces a diameter of the portion of the heating electrode exposed by the first dielectric layer to about 5-1000 Å.

4. The method as claimed in claim 1, wherein the heating electrode comprises doped Si, doped SiGe, titanium nitride (TiN) or tungsten titanium (TiW).

5. The method as claimed in claim 1, wherein a bottom surface of the oxide spacer is slightly lower than a top surface of the first dielectric layer.

6. The method as claimed in claim 1, wherein the oxide layer has a substantially reversed U shape configuration.

7. The method as claimed in claim 1, wherein the phase change material layer comprises chalcogenide materials.

8. A method for fabricating a phase change memory device, comprising:
    providing a substrate with a first conductive layer formed thereon;
    forming a first dielectric layer over the first conductive layer and the substrate;
    forming a heating electrode in a portion of the first dielectric layer, wherein the heating electrode penetrates the first dielectric layer and contacts the first conductive layer;
    performing a first etching process, reducing a thickness of the first dielectric layer and partially exposing a portion of the heating electrode;
    performing an oxidation process, forming a first oxide layer on a top surface and a sidewall of the portion of the heating electrode exposed by the first dielectric layer;
    forming a second dielectric layer over the first dielectric layer, covering the first dielectric layer;
    performing a planarization process, removing portions of the first oxide layer and the second dielectric layer, revealing a top surface of the portion of the heating electrode exposed by the first dielectric layer and leaving a second oxide layer on the sidewall of the portion of the portion of the heating electrode exposed by the first dielectric layer;
    forming a phase change material layer over a portion of the second dielectric layer, wherein the phase change material layer merely contacts the top surface of the conductive electrode and the second oxide layer; and
    forming a second conductive layer over the phase change material layer, contacting the phase change material layer.

9. The method as claimed in claim 8, wherein the oxidation process is performed under a temperature of about 500-1000° C. for about 1-600 minutes.

10. The method as claimed in claim 9, wherein the oxidation process reduces a diameter of the portion of the heating electrode exposed by the first dielectric layer to about 5-1000 Å.

11. The method as claimed in claim 9, wherein the heating electrode comprises doped Si, doped SiGe, titanium nitride or tungsten titanium.

12. The method as claimed in claim 9, wherein a bottom surface of the oxide spacer is slightly lower than the top surface of the first dielectric layer.

13. The method as claimed in claim 9, wherein the oxide layer has a substantially reversed U shape configuration.

14. The method as claimed in claim 9, wherein the phase change material layer comprises chalcogenide materials.

15. A method for reducing a contact area between a heating electrode and a phase change material layer, comprising:
    providing a first dielectric layer with a heating electrode formed therein, wherein the heating electrode has a first diameter and an exposed portion above a top surface of the first dielectric layer;
    performing an oxidation process, forming an oxide layer on a top surface and a sidewall of the exposed portion of the heating electrode, reducing a diameter of the exposed portion of the heating electrode from the first diameter to a second diameter less than thereof;
    partially removing the oxide layer, exposing a top surface of the exposed portion of the heating electrode and leaving an oxide spacer on the sidewall thereof; and
    forming a phase change material layer over the exposed portion of the heating electrode, wherein the phase change material layer at least contact the top surface of the exposed portion of the heating electrode and a top surface of the oxide spacer.

16. The method as claimed in claim 15, wherein the oxide layer is partially removed by an etching process.

17. The method as claimed in claim 15, further comprising forming a second dielectric layer over the first dielectric layer prior to partially removal of the oxide layer, wherein the second dielectric layer covers the oxide layer and the exposed portion of the heating electrode.

18. The method as claimed in claim 17, wherein the oxide layer is partially removed by a chemical mechanical polishing process.

* * * * *